United States Patent
Mannhart et al.

(10) Patent No.: US 12,288,816 B2
(45) Date of Patent: Apr. 29, 2025

(54) MAGNETIC-FIELD FREE, NONRECIPROCAL, SOLID STATE QUANTUM DEVICE USING QUANTUM WAVE COLLAPSE AND INTERFERENCE

(71) Applicant: Max-Planck-Gesellschaft Zur Förderung Der Wissenschaften E.V., Munich (DE)

(72) Inventors: Jochen Mannhart, Böblingen (DE); Daniel Braak, Augsburg (DE); Johannes Arnoldus Boschker, Stuttgart (DE); Philipp Michael Bredol, Stuttgart (DE)

(73) Assignee: Max-Planck-Gesellschaft Zur Förderung Der Wissenschaften E.V., Munich (DE)

( * ) Notice: Subject to any disclaimer, the term of this patent is extended or adjusted under 35 U.S.C. 154(b) by 623 days.

(21) Appl. No.: 17/630,102

(22) PCT Filed: Jul. 3, 2020

(86) PCT No.: PCT/EP2020/068812
§ 371 (c)(1),
(2) Date: Jan. 25, 2022

(87) PCT Pub. No.: WO2021/018515
PCT Pub. Date: Feb. 4, 2021

(65) Prior Publication Data
US 2022/0352356 A1 Nov. 3, 2022

(30) Foreign Application Priority Data
Jul. 26, 2019 (EP) .................................... 19188523

(51) Int. Cl.
*H01L 29/66* (2006.01)
*G06N 10/40* (2022.01)
*H01L 29/06* (2006.01)

(52) U.S. Cl.
CPC ....... *H01L 29/66977* (2013.01); *G06N 10/40* (2022.01); *H01L 29/0688* (2013.01)

(58) Field of Classification Search
CPC .......... H01L 29/66977; H01L 29/0688; H01L 29/0665; H01L 29/32; H01L 29/36;
(Continued)

(56) References Cited

U.S. PATENT DOCUMENTS 6,169,105 B1  1/2001  Wong et al.
7,689,068 B1 *  3/2010  Wang ................. B82Y 20/00
                                                        385/129
(Continued)

FOREIGN PATENT DOCUMENTS

EP  3588671 A1  1/2018
EP  3624365 A1  3/2020
(Continued)

OTHER PUBLICATIONS

Söllner, I., Mahmoodian, S., Hansen, S. et al. Deterministic photon-emitter coupling in chiral photonic circuits. Nature Nanotech 10, 775-778 (2015). https://doi.org/10.1038/nnano.2015.159. (Year: 2015).*
(Continued)

*Primary Examiner* — J. E. Schoenholtz
(74) *Attorney, Agent, or Firm* — TraskBritt

(57) ABSTRACT

The quantum device comprises a transmission structure, wherein based on its geometrical arrangement, interference and quantum collapse, the transmission structure is designed such that quantum waves emitted by at least two bodies, for
(Continued)

example, by thermal excitation, are passed preferentially to a subset of these bodies, without the need for a magnetic field to be applied.

21 Claims, 13 Drawing Sheets

(58) Field of Classification Search
CPC ........ G06N 10/40; G06N 10/00; B82Y 10/00; H10N 70/00
See application file for complete search history.

(56) References Cited

U.S. PATENT DOCUMENTS

| 2003/0111661 | A1 | 6/2003 | Tzalenchuk et al. |
| 2008/0136454 | A1 | 6/2008 | Diduck et al. |
| 2011/0017284 | A1 | 1/2011 | Moddel |

FOREIGN PATENT DOCUMENTS

| WO | 2008/122561 A1 | 10/2008 |
| WO | 2019/060589 A1 | 3/2019 |

OTHER PUBLICATIONS

Gonzalez-Ballestero, Carlos, et al. "Nonreciprocal few-photon routing schemes based on chiral waveguide-emitter couplings." Physical Review A, vol. 94, No. 6, Dec. 6, 2016, https://doi.org/10.1103/physreva.94.063817. (Year: 2016).*
Braak et al. "Inconsistency between Thermodynamics and Probabilistic Quantum Processes" Arxiv. Org. Cornell University Library. 201 OlIn Library Cornell University Ithaca, NY 14853, Nov. 7, 2018.
Ferry et al. "Transport in Nanostructures", Cambridge University Press (2009) (Abstract Only).
Hänggi et al. "Artificial Brownian motors: Controlling transport on the nanoscale" Rev. Mod. Phys. 81, 387-442 (Mar. 2009).
International Search Report for International Application No. PCT/EP2020/068812, mailed Sep. 15, 2020, 4 pages.
International Written Opinion for International Application No. PCT/EP2020/068812, mailed Sep. 15, 2020, 12 pages.
Johnson "Thermal Agitation of Electricity in Conductors" Phys. Rev., vol. 32(1) 97-109 (Jul. 1928).
Krstic et al. "Magneto-chiral anisotropy in charge transport through single-walled carbon nanotubes" J. Chem. Phys. 117, 11315-11319 (Dec. 2002)—Abstract Only.
Leturcq et al."Magnetic Field Symmetry and Phase Rigidity of the Nonlinear Conductance in a Ring" Phys. Rev. Lett. 96(12): 126801 (Apr. 2006).
Linke et al: "A quantum dot ratchet: experiment and theory" Europhysics Letters: A Letters Journal Exploring The Frontiers Of Physics. Institute Of Physics Publishing Bristol, FR, vol. 44, No. 3, Nov. 1, 1998 (Nov. 1, 1998) , pp. 341-347.
Mannhart "Non-reciprocalInterferometers for Matter Waves" Journal Of Superconouctivity Ano Novel Magnetism Springer US, Boston, vol. 31 , No. 6, Mar. 26, 2018 pp. 1649-1657.

Mannhart et al. "Lossless Currents at High Temperatures" Journal of Superconductivity and Novel Magnetism (2019) 32: pp. 17-21 Accepted: Aug. 16, 2018).
Mannhart et al. "Phase filters for a novel kind of asymmetric transport—Scientific prospects and opportunities for possible applications" Physica E: Low-dimensional Systems and Nanostructures, vol. 109, May 2019, pp. 198-200.
Marlow et al. "Experimental Investigation of the Breakdown of the Onsager-Casimir Relations", Phys. Rev. Lett. 96, 116801 (Mar. 2006).
Merali "Bending the Rules: Thermodynamics might operate differently in the quantum realm, Experiments are starting to put the idea to the test" Nature vol. 551, pp. 20-22 (Nov. 2017).
Nieuwenhuizen et al."Statistical thermodynamics of quantum Brownian motion: Construction of perpetuum mobile of the second kind" Phys Rev E Stat Nonlin Soft Matter Phys. Rev. E 66, 036102 (Sep. 2002).
Nyquist "Thermal Agitation of Electric Charge in Conductors" Phys. Rev., vol. 32, 110 (Jul. 1928).
Parrondo et al. "Energetics of Brownian motors: A review" Appl. Phys. A 75, 179-191 (Aug. 2002).
Vinjanampathy et al. "Quantum thermodynamics" Contemporary Physics, vol. 57, Issue 4, pp. 545-579, Publicshed online: Jul. 20, 2016 :DOI: 10.1080/00107514.2016.1201896.
Zhu et al: "Optical rectenna solar cells using graphene geometric diodes" Photovol Taic Specialsts Conference (PVSC), 2011 37TH IEEE, IEEE, Jun. 19, 2011 (Jun. 19, 2011, pp. 2120-2122.
Zumbühl et al. "Asymmetry of Nonlinear Transport and Electron Interactions in Quantum Dots" Phys. Rev. Lett. 96, 206802 (Jun. 2006).
Chinese First Office Action for Chinese Application No. 202080053682, dated Sep. 7, 2023, 12 pages with translation.
Chinese Search Report for Chinese Application No. 202080053682, dated Sep. 7, 2023, 2 pages.
Japanese Decision to Grant a Patent for Japanese Application No. 2022-501349, dated Dec. 12, 2023, 5 pages with English translation.
Japanese Notice of Reasons for Refusal for Japanese Application No. 2022-501349, dated Jun. 6, 2023, 6 pages with English translation.
Scorza et al "Preclinical and clinical characterization of the selective 5-HT(1A) receptor antagonist DU-125530 for antidepressant treatment" British Journal of Pharmacology, vol. 167, No. 5 (2012) pp. 1021-1034, accepted Oct. 23, 2011.
Waldinger et al "On-Demand SSRI Treatment of Premature Ejaculation: Pharmacodynamic Limitations for Relevant Ejaculation Delay and Consequent Solutions" Journal of Sexual Medicine, Blackwell Publishing Ltd., Oxford, GB, vol. 2, No. 1 (Jan. 2005) pp. 121-131.
Cohen-Tannoudji et al. "Quantum Mechanics" Wiley, 2005.
Imry "Introduction to Mesoscopic Physics" Oxford University Press (2002).
Datta "Electronic Transport in Mesoscopic Systems" Cambridge University Press (1995).
Reichl "A Modern Course in Statistical Physics" E. Arnold, 1980.
Capek et al. "Challenges to the Second Law of Thermodynamics" Springer 2005.

* cited by examiner

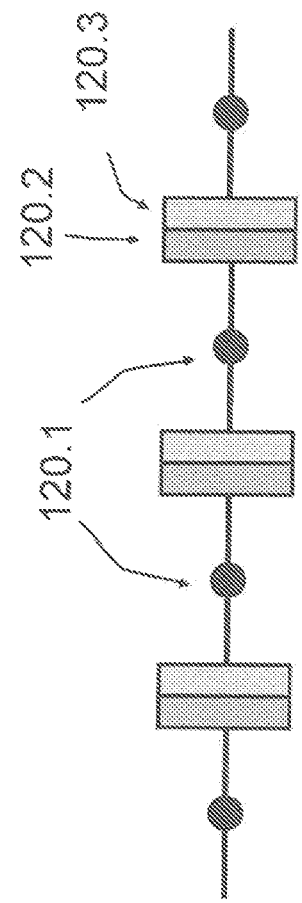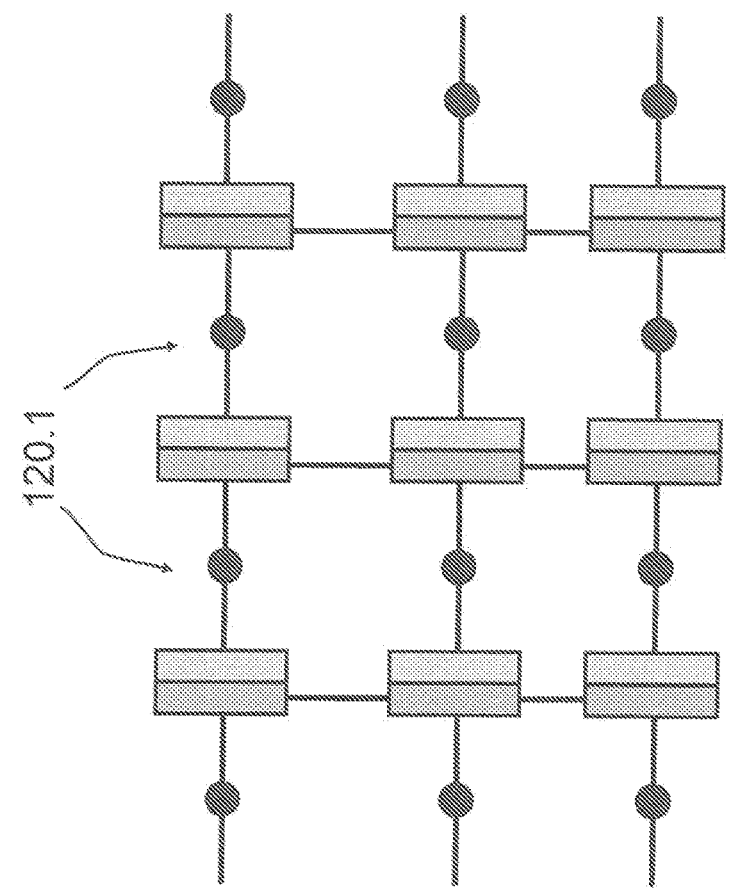
FIG. 12A
FIG. 12B

MAGNETIC-FIELD FREE, NONRECIPROCAL, SOLID STATE QUANTUM DEVICE USING QUANTUM WAVE COLLAPSE AND INTERFERENCE

CROSS-REFERENCE TO RELATED APPLICATIONS

This application is a national phase entry under 35 U.S.C. § 371 of International Patent Application PCT/EP2020/068812, filed Jul. 3, 2020, designating the United States of America and published as International Patent Publication WO 2021/018515 A1 on Feb. 4, 2021, which claims the benefit under Article 8 of the Patent Cooperation Treaty to European Patent Application Serial No. 19188523.5, filed Jul. 26, 2019.

TECHNICAL FIELD

The present disclosure relates to a nonreciprocal solid-state quantum device comprising a transmission structure between first and second ports that utilizes the at least partial collapse or decoherence of quantum waves and their interference to shift two or more bodies into a new equilibrium state. An asymmetry of the transmission structure or the ports allows for a function of the device even without applied magnetic field. The present disclosure also relates to a method for operating such a quantum device and to a use of one or more of such quantum devices in numerous different devices.

BACKGROUND

In the following description reference will be made to the following documents:

1. J. Mannhart, J. Supercond. Novel. Magn. 31, 1649 (2018)=Mannhart 2018A
2. J. Mannhart and D. Braak, J. Supercond. Novel. Magn. 10.1007/s10948-018-4844-(2018)=Mannhart 2018B
3. J. Mannhart, P. Bredol, and D. Braak, Physica E 109, 198-200 (2019)
4. "Inconsistency between Thermodynamics and Probabilistic Quantum Processes" D. Braak and J. Mannhart arXiv: 1811.02983 (2018)
5. D. Braak and J. Mannhart 2018, EP 18194460
6. J. Mannhart, EP Patent Application "Non-reciprocal filters for matter waves"
7. D. Braak and J. Mannhart, European Patent Application No. 18 180 759.5 "A Non-reciprocal Device Comprising Asymmetric Phase Transport of Waves."
8. C. Cohen-Tannoudji, B. Diu, F. Laloe, *Quantum Mechanics*, Wiley, 2005
9. Y. Imry, "Introduction to Mesoscopic Physics," Oxford University Press (2002)
10. S. Datta, "Electronic Transport in Mesoscopic Systems," Cambridge University Press (1995).
11. J. Johnson, Phys. Rev. 32, 97 (1928).
12. H. Nyquist, Phys. Rev. 32, 110 (1928).
13. J. M. R. Parrondo and B. J. de Cisneros, Appl. Phys. A 75, 179-191 (2002)
14. P. Hanggi, Rev. Mod. Phys. 81, 387-442 (2009)
15. C. A. Marlow et al., Phys. Rev. Lett. 96, 116801 (2006)
16. D. M. Zumbal et al., Phys. Rev. Lett. 96, 206802 (2006)
17. R. Leturcq et al., Phys. Rev. Lett. 96, 126801 (2006)
18. V. Krstic et al., J. Chem. Phys. 117, 11315-11319 (2002)
19. Th. M. Nieuwenhuizen, A. E. Allahverdyan, Phys. Rev. E, 036102 (2002).
20. S. Vinjanampathy and J. Anders, Contemporary Physics 57, 545 (2016).
21. Z. Merali, Nature 551, 20 (2017)
22. D. K. Ferry, S. M. Goodnick, and J. Bird, "Transport in Nanostructures," Cambridge University Press (2009)
23. L. E. Reichl, "A Modern Course in Statistical Physics," E. Arnold, 1980
24. V. Capek and D. P. Sheehan, "Challenges to the Second Law of Thermodynamics," Springer 2005

In Ref (Mannhart, Braak, EP Application "Non-reciprocal filters for matter waves;" No. 18 180 759.5; Mannhart 2018A; Mannhart 2018B; Mannhart 2019) nonreciprocal solid state quantum devices have been disclosed that break the second law of thermodynamics by altering quantum waves using magnetic fields. In Ref (Braak, 2018; Braak EP Patent Application No. 18194460) further devices have been disclosed, which achieve a related function using photonic systems based on chiral structures. The present disclosure shows a way in which an equivalent breaking of the zeroth and the second law of thermodynamics is provided by even simpler solid state devices that utilize solely the collapse of quantum waves, their interference, and a suitable device asymmetry, without the need to apply magnetic fields or chiral structures, thereby strengthening their applicability. Despite the abolished need of magnetic fields, the devices disclosed here resemble in numerous features of their usage and in parts of their function the devices disclosed in Ref. (D. Braak and J. Mannhart, European Patent Application No. 18 180 759.5 "A Non-reciprocal Device Comprising Asymmetric Phase Transport of Waves").

BRIEF SUMMARY

In accordance with a first aspect of the present disclosure a quantum device comprises a transmission structure connected between at least a first port and a second port, wherein first quantum waves are emitted by the first and second ports and traverse the transmission structure in a forward direction from the first port to the second and in a backward direction from the second port to the first port; wherein a unit of the transmission structure together with the first and second ports is asymmetric in the direction connecting the ports, and wherein the transmission structure or the first and second ports are furthermore configured such that wave functions of the first quantum waves experience an at least partial collapse or decoherence in the transmission structure or in the first or second ports, or are generated by an at least partial collapse or decoherence in the first or second port, and wherein second quantum waves generated by the at least partial collapse or decoherence of the first quantum waves propagate to one of the first and second ports or generate further second quantum waves.

According to a first embodiment an asymmetry in the transmission time of the first quantum waves can be induced, such that waves travelling from port A to port B spend a shorter time in the device than quantum waves travelling from port B to port A. This difference in the transmission time is induced without the need for magnetic fields or for chiral structures. By this, the number of collapses of the quantum waves travelling from port B to port A is larger than the number of collapses of quantum waves travelling in the opposite direction.

This larger number of collapses leads to a larger number of second quantum waves generated with a randomized direction of travel in the device. Therefore, even if ports A and B emit an equal number of quantum waves, a net transport of quantum waves from port A to port B is achieved.

According to a second embodiment the first and second ports are fabricated of different materials, which leads to the emission of different wave packets, which encounter different transition times through the transmission structure.

In accordance with a second aspect of the present disclosure, one or more quantum devices according to the first aspect are used in one or more of a device in which the quantum waves are given by the de-Broglie waves of electrons or by the electromagnetic waves of photons;
- a device in which the first waves comprise quanta with energies obtained from a thermal source or with excitation energies E of order kT, such that $0 < E < 100$ kT, wherein T is the temperature of the environment;
- a device utilizing quantum-mechanical superposition of states and at least partial collapses of wave functions to achieve a deviation from one or more of the zeroth or the second law of thermodynamics;
- a device utilizing at least partial quantum-physical collapses of wave functions or quantum-mechanical superposition of states and at least partial collapses of wave functions to shift a system out of the state of thermal equilibrium characterized by an equal temperature of the device components;
- a device utilizing at least partial quantum-physical collapses of wave functions or quantum-mechanical superposition of states and at least partial collapses of wave functions to generate temperature differences or energy density differences within one body or between several bodies;
- a device performing heating, cooling, matter transport, energy transport, or power generation.

In accordance with a third aspect of the present disclosure, a method for operating a quantum device of the first aspect comprises providing one or more sources of the first waves, wherein at least one source of the first waves is held in thermal contact with an environment. The environment can be a natural environment like a room being at room temperature, or a place in free nature. It can also be an artificial environment such as the cavity containing the device, or such as a thermal bath provided, for example, by a water bath or a hot oven.

According to an embodiment, no external voltage the quantum devices described further below do not require the application of an external voltage between the first port A and the second port B.

According to an embodiment, the quantum device is configured to work in the linear response regime utilizing quantum mechanical superposition of states and at least partial collapses or decoherence of wave functions. In signal theory and in transport theory, the linear response regime is distinguished from the nonlinear response regime. We elucidate the difference here using an example from transport theory. We take a system such as a wire that is biased with a current I as an input signal. The wire then generates a voltage V (output signal). For small current biases, In the regime of ohmic transport, V depends linearly on I: $V = R\_0 \, I$; with the resistance $R\_0$ as proportionality constant. This is transport in the linear regime. For larger current biases, heating of the wire by the current becomes relevant. Also the magnetic fields induced by the current may affect the wire resistance so that it differs from $R\_0$. In these cases, V changes as a function of I in a nonlinear manner, for example, like $V = R\_0 \, I + a \, I^2 + \ldots$ (=nonlinear regime).

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and serve together with the description to explain principles of examples. Other examples and many of the intended advantages of examples will be readily appreciated as they become better understood by reference to the following detailed description.

FIG. 9B shows that the structure has a higher transmission for electrons travelling from the left to the right than for electrons travelling in the reverse direction.

FIG. 12 comprises FIG. 12A and FIG. 12B. FIG. 12A shows a one-dimensional array of transmission structures. While the inner part of the transmission structures is completely symmetric, they are connected to contacts with a longitudinal asymmetry, which is key for the device function. FIG. 12B shows a two-dimensional extension of the array shown in FIG. 12A.

DETAILED DESCRIPTION

Figure 1A:
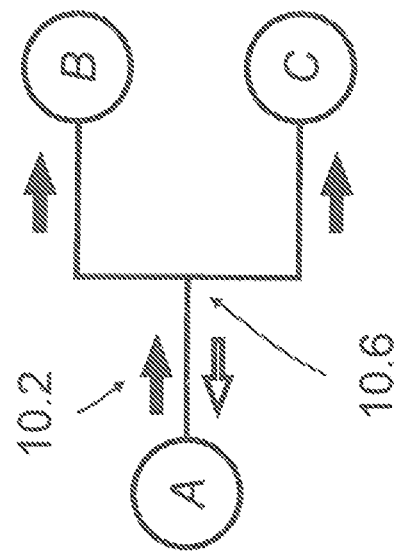
FIG. 1 comprises FIGS. 1A, 1B, 1C and 1D and shows the transmission and reflection of quantum waves at two y-junctions of different geometries, for waves arriving from the left and from the right to the junctions.

The term "wave" is used to describe any wave associated with a quantum object, be it, for example, the wave of a photon or a de-Broglie wave of a particle or quasi-particle. The considered waves are created/modified in elementary interaction processes, which must be described quantum mechanically and may undergo quantum mechanical collapse under conditions such as detailed, for example, in [Cohen]. Besides that, the term "wave" also includes wave packets, for examples wave packets with Gaussian envelope functions.

The term "collapse" is used to describe any process causing an at least partially phase-breaking decoherence of quantum-mechanical states.

When describing and claiming a quantum device in the following, it should be noted that the term "quantum device" is to be understood in a broad and extensive manner. Concerning the function of the devices revealed here, such a device basically acts as a device for matter or electromagnetic waves, for example, for photons, particle waves, quasiparticle waves. Concerning its structure it can be understood as an artificial or man-made structure in which, for example, optical transmission paths, electromagnetic waveguides, electrical wires or lines are fabricated by different technological methods, including integrated circuit technology. It can, however, also be understood as consisting of or comprising chemical components like, for example, molecules, molecule compounds, molecule rings like benzene rings with side groups, and so on. It furthermore can refer to solid compounds, e.g., with crystalline structures that exert the device function, or to structures fabricated in or from such crystalline structures.

Furthermore the term "transmission path" can be, but does not have to be understood as a material body. In some devices a material body, e.g., a piece of wire or a waveguide, may comprise one transmission path. In some other devices such a material body may comprise two transmission paths, namely two opposing directions of particles propagating through the material body. In some other devices the term is not to be understood as a tangible or material body, which is fabricated from a specific material. It is rather to be understood as a virtual path of a particle or wave in space, and may even be placed, e.g., in a gaseous atmosphere.

Also, the term "random" is used here to not only describe processes of completely random nature. The term is also used to describe, for example, distributions of phases that are so irregular that interference events between waves with such phases are significantly oppressed.

The term "phase coherent" does not necessarily imply that there is no inelastic, phase-breaking scattering taking place in the device. Indeed, as shown in [Imry], some inelastic scattering, for example, with phonons, is compatible with phase coherence of the part of the wave not affected by the scattering and may be beneficial or in some cases even be required for device operation. The term "phase coherent" should therefore be understood as including either the absence of inelastic, phase-breaking scattering of the transmission of particles in the device, or to also include the presence of such events, provided that a part of the wave with a phase unaffected by phase-breaking scattering events remains.

Furthermore, any features, remarks, or comments, mentioned in connection with one or more quantum device or a use of one or more quantum devices are to be understood as also disclosing a respective method feature or method step for making the quantum device(s) function or for implementing the quantum device(s) in any kind of greater device or system and driving the quantum device(s) so that such greater device or system will fulfill its desired function.

Figure 1B:
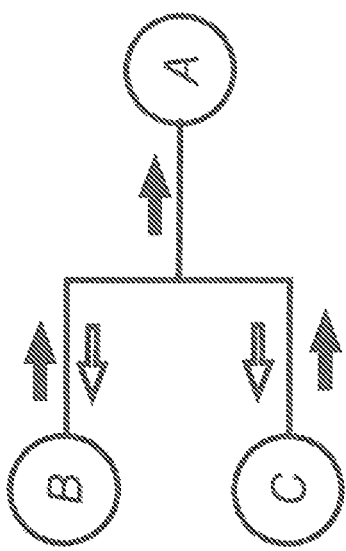

FIG. 1A and FIG. 1B show two wave packets 10.2 originating from a port A and impinging in transmission structures on two y-type junctions of different geometries (10.1 and 10.6). These y-junctions lead to the ports B and C. No external voltage is applied between port A and ports B and C. The lines between the y-junctions 10.1 and 10.6 and the ports A, B and C may represent electrical wires for the transport of electrons. In case the wave packet consists of the de-Broglie wave of an electron, the time evolution of the wave packet is described by the Schrödinger equation of quantum mechanics. Accordingly, the wave packet will be split in three parts. One part (10.3) of the wave packet is reflected back to the port A. The rest of the wave packet is split into two parts (10.4, 10.5). These transmitted wave packets travel to ports B and C, respectively. The relative ratios of the amplitudes of the reflected and transmitted wave packets with respect to the amplitude of the originally impinging wave packets are described by the respective coefficients of reflection (R) and transmission (T), whereby $R^2+T^2=1$ [Imry].

As the Schrödinger equation entails, the reflection and transmission coefficients depend on both the shape of the wave packet and on the geometry of the junction. Specifically, for many wave packets, the reflection coefficient of the junction geometry shown in FIG. 1B (10.6) is larger than that of the geometry shown in FIG. 1A (10.1).

Figure 1C:
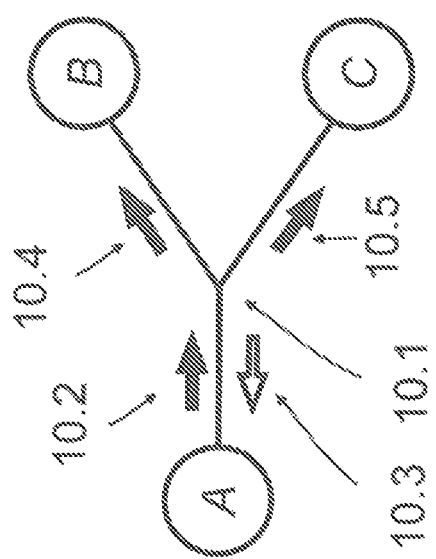
Figure 1D:
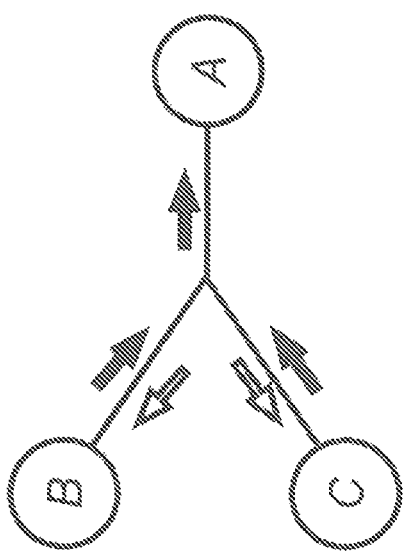

By the same token, the reflection and transmission coefficients are functions of the wave packet shape and the junction geometry in case the wave packets arrive from the other side of the y-junctions, as illustrated in FIG. 1C and FIG. 1D.

Figure 2:
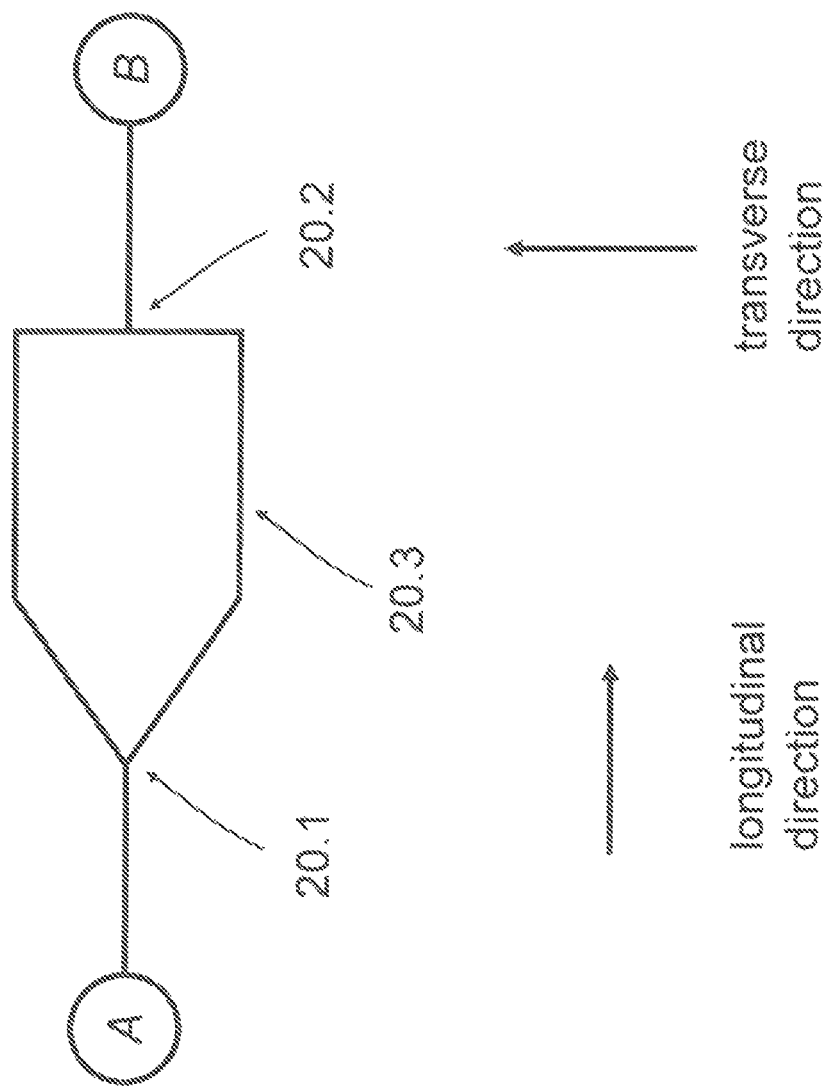
FIG. 2 shows a transmission structure with a longitudinal symmetry connecting two ports A and B. The transmission structures consist of the two different y-junctions introduced in FIG. 1. These y-junctions are connected in series.

FIG. 2 shows a transmission structure that consists of two different junctions connected in series to form a loop. For such a two-terminal device the laws of the unitary evolution of quantum states require that those reflection and transmission coefficients that characterize the reflection and transmission of quantum waves through the complete device are symmetric with respect to the travel direction of the wave packet [Datta]. However, because of the different coefficients of the two y-junctions, the time evolutions of the wave packets differ, depending on whether they originate from port A or port B. To point out one difference as example: waves travelling from B onto the device are reflected with a higher probability by the right y-junction (20.2), than the waves travelling from port A are reflected by the left y-junction (20.1). These different effective trajectories of the wave packets cause the average travel times of a wave to be different for the two travel directions (i.e., from port A to port B or vice versa). In particular, the average time a quantum wave spends in the loop is a function of the travel direction. FIG. 2 also illustrates the terms "longitudinal direction" and "transverse direction."

Figure 3A:
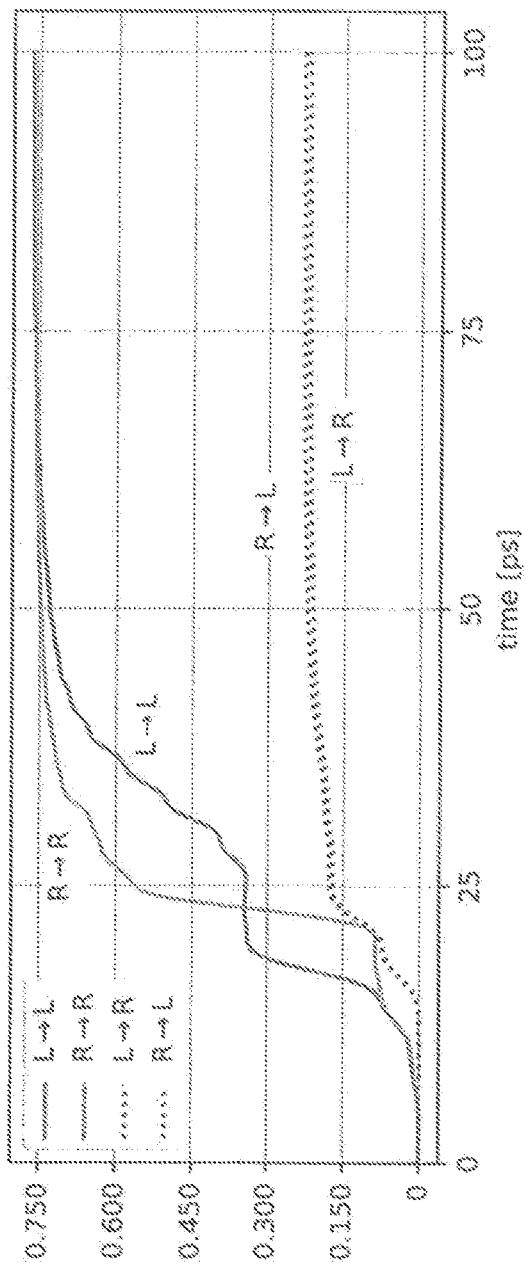
FIG. 3A presents the transition time difference for wave packets describing electrons travelling from the left to the right and in reverse direction through the structure shown in FIG. 3B. The transition times have been calculated by solving the Schrödinger equation using exact diagonalization.
Figure 3B:
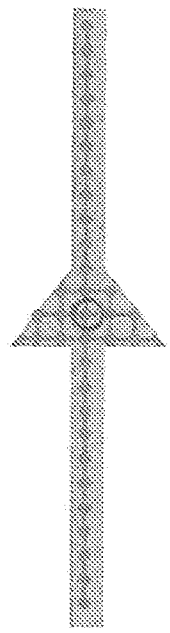
FIG. 3 comprises FIG. 3A and FIG. 3B.

FIG. 3A exemplifies this surprising behavior by showing the results of a strict numerical solution of the Schrödinger equation by exact diagonalization for the passage of electron wave packets through a transmission structure shown in FIG. 3B.

More specifically, FIG. 3A gives as a result of the solution of the Schrödinger equation the transmission and reflection probabilities for electron wave packets passing through the device shown in FIG. 3B, or being reflected by the device. L→L refers to the electrons that come from the left and are reflected to the left, R→R refers to the electrons that come from the right and are reflected to the right, L→R refers to the electrons that come from the left and are transmitted to the right, and R→L refers to the electrons that come from the right and are transmitted to the left. The calculation shows the transmission and reflection of electrons across the structure, starting at a time t=0 ps, at which the device is assembled to be in thermal equilibrium. At t=0, each part of the device is at the same temperature. Due to the described function of the device, the device then starts to transmit and reflect the electron wave function with the time dependences shown, such that at times of about >80 ps, the electron wave function has almost completely reached the ports into which it has been transmitted or reflected. The structure shown has identical transmission probabilities (L→R=R→L). The time dependences of the reflection probabilities differ, however. These calculations refer to the case without scattering. The time units are psec. The time scale of this particular example refers to a structure as shown in FIG. 3B with a lattice-point spacing of 10 nm and the motion of an electron with a free electron mass, a medium wavelength of 60 nm, and a wave-packet width of 50 nm.

FIG. 3B shows the exemplary structure with a longitudinal asymmetry used to calculate FIG. 3A for which the Schrödinger equation has been solved by exact diagonalization using a tight-binding model with reference to the lattice points drawn as black dots. In some cases, these lattice points may be visualized, for example, as atoms. The white circle marks the lattice point that is the location of the potential inelastic scattering center.

Figure 4:
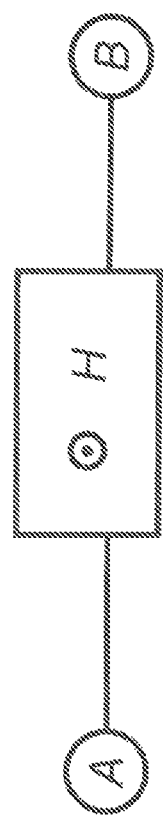
FIG. 4 shows a transmission structure that uses a transverse asymmetry to connect two ports A and B. This device also uses a magnetic field H applied to the device out-of-plane.

The quantum rings disclosed in Ref. (Mannhart, EP Patent Application "Non-reciprocal filters for matter waves;" Braak, 18 180 759.5; Mannhart 2018A; Mannhart 2018B; Mannhart 2019) are characterized by the same behavior of their time delay. In the rings revealed in Ref. (Mannhart, EP Patent Application "Non-reciprocal filters for matter waves;" Braak, 18 180 759.5; Mannhart 2018A; Mannhart 2018B; Mannhart 2019), this behavior is induced by breaking the transverse symmetry of the rings (i.e., the symmetry perpendicular to the trajectory path, see FIG. 2), as exemplified by FIG. 4. Breaking of the transverse symmetry leads to a difference in the transition times only in the presence of a magnetic field H of an appropriate strength penetrating the loop, because the magnetic field is needed to couple the transverse asymmetry into a longitudinal symmetry breaking. The devices disclosed in Ref (Mannhart, EP Patent Application "Non-reciprocal filters for matter waves;" Braak, 18 180 759.5; Mannhart 2018A; Mannhart 2018B; Mannhart 2019) therefore require the application of magnetic fields. Devices with a longitudinal asymmetry (FIG. 2) do not require applied magnetic fields. Regarding parameter control, complexity, size, weight, and cost, not needing magnetic fields provides obvious decisive advantages for many applications of the devices.

In essence, the combination of the geometrical longitudinal device asymmetry in conjunction with the time reversal asymmetry inherent to collapse events suffices to induce a time-reversal symmetry breaking for the transport of quantum waves through the whole device.

Figure 5:
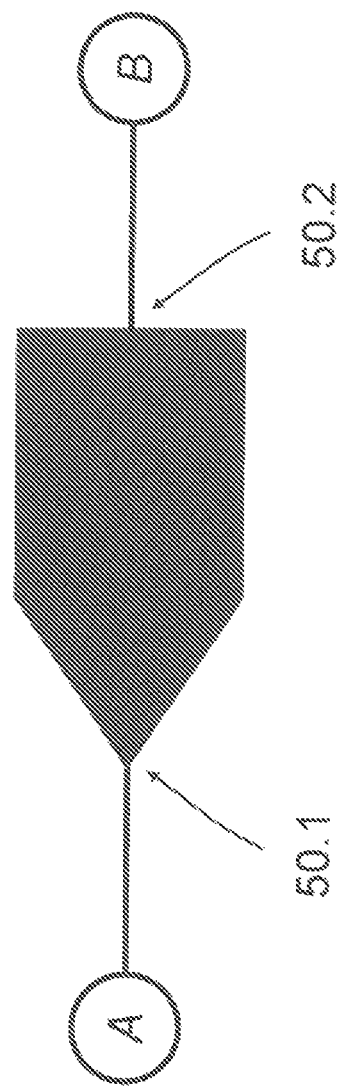
FIG. 5 shows a transmission structure that uses a simply connected body with a longitudinal asymmetry to connect two ports A and B.

It is important to note that the time difference effect arising from the longitudinal symmetry is not restricted to multiple connected paths, for which FIG. 2 provides an example. The same asymmetry is achieved even in simply connected transmission paths as exemplified in FIG. 5. This is obvious, as the contacts 50.1 and 50.2 contacting the left and the right sides of the central part of the device, respectively, have different shapes. Unlike the example of FIG. 2, the transmission structure of the example of FIG. 5 not only comprises electrical lines, but also one extended area connected by electrical lines with the ports A and B. The extended area comprises longitudinal asymmetry such that the contact 50.2 comprises a higher reflection probability for electrons emitted by port B than for contact 50.1 for electrons emitted by port A. Consequently the device of FIG. 5 may function in the same way as the device of FIG. 2.

Figure 6:
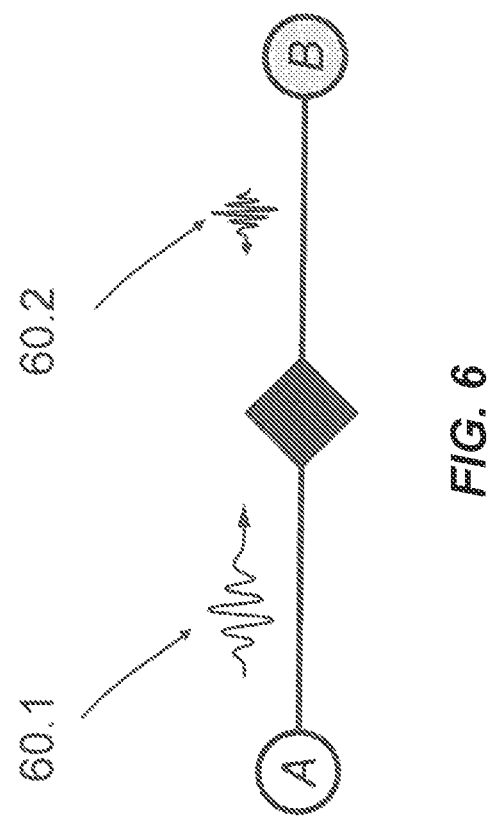
FIG. 6 shows a transmission structure that uses a completely symmetric and simply connected area to connect two ports A and B. The function of this device is based on the fact that the two contacts A and B differ in their electronic behavior, such that the electron wave packets port A emits differ by the shape of their envelopes from the wave packets emitted by port B.

It is furthermore important to understand that the time difference effect revealed is even induced in transmission structures in which the longitudinal asymmetry is induced by the contacts or ports only, as illustrated in FIG. 6. If the two ports A and B emit wave packets 60.1 and 60.2 of different shapes, but possibly even with the same average momentum and energy, the transmission times will differ for the wave packets travelling in opposite directions. Such a constellation can be provided if the ports A and B are made of different materials as, for example, two different electrically conductive contacts with differing properties of their electron systems such as their spectral density of states of their electron or phonon systems, or with differing defect populations. The two contact can be made of two different metallic materials like, for example, Cu and Al, Cu and a Cu alloy, or metal and highly doped semiconductor. The inner rhombic part depicted in the center of the transmission structure can be of any kind and form and can, in particular, be formed longitudinal symmetric.

It is important to understand another key aspect of the disclosure: the functions of the devices with broken symmetries of the transmission time are accomplished by adding features to the transmission paths that cause in the device at least partial phase decoherence or at least partial quantum mechanical collapse processes of the quantum waves. This collapse causes a loss of information of the wave's phase, because the dissipative coupling of the absorbed wave to a macroscopic bath induces decoherence, a process which has been many times referred to as "quantum mechanical measurement process" [Cohen].

The principle action of a so-called trapping site causing inelastic scattering of an electron wave and thereby the collapse of the wave function is presented in FIGS. 7A-7D as an example to explain the characteristic behavior of such collapse events integrated into the device function.

Figure 7A:
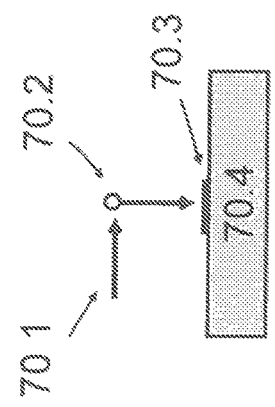
FIG. 7 comprises FIGS. 7A, 7B, 7C and 7D. The Figure shows how electron wave packets arriving from the left (FIG. 7A) and from the right (FIG. 7C) are trapped at a defect at time t1. At a later time t2, the electrons are released (FIG. 7B, FIG. 7D) and the electrons travel stochastically to the left or to the right, independent of their original travel direction as incoming waves.

FIG. 7A shows an electron wave 70.1 coming from the left and impinging at time t1 onto a trapping center 70.2, which acts as inelastic scatterer and traps the electron at an energy level 70.3, which is lower than the energy level of the incoming electron wave 70.1. The momentum of the incoming electron is transferred by the scattering site to a macroscopic thermal bath 70.4, which e.g., is provided by the crystal lattice of a substrate. This transfer also causes an effective loss of the phase memory of the electron wave.

Figure 7B:
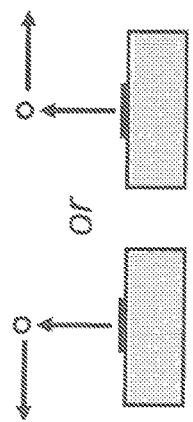
Figure 7C:
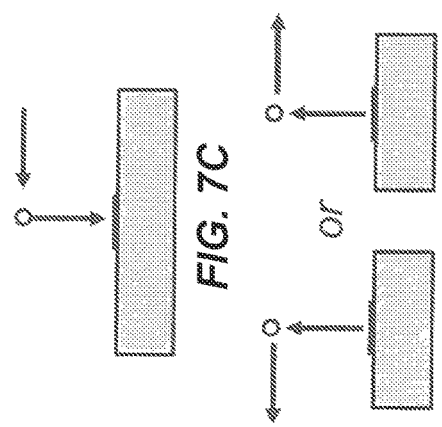

As shown by FIG. 7B, at a later time t2, the electron wave is freed from this trapping site, for example, by thermal excitations arising from the thermal bath 70.4. Because of the loss of the memory of the direction and phase of the incoming electron, the electron is now emitted in a stochastic process with equal probability to the left and to the right.

Figure 7D:
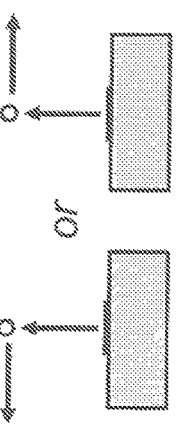

By symmetry reasons, electrons that originally arrive from the right (FIG. 7C) behave in the same manner (FIG. 7D).

Figure 8:
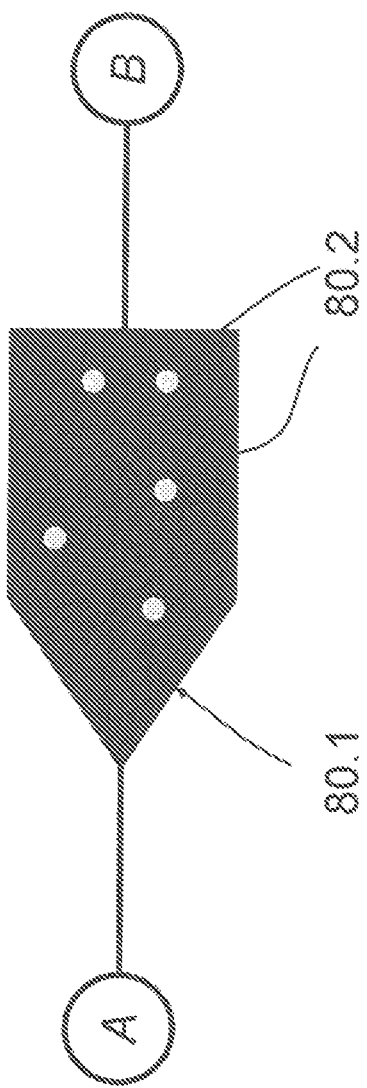
FIG. 8 shows a transmission structure that uses a simply connected area with a longitudinal asymmetry to connect two ports A and B. The transmission structure as drawn comprises five inelastic scattering centers that have been incorporated into the device architecture during its manufacture.

This inelastic scattering is commonly induced by, for example, electron-phonon scattering or by scattering of electrons at irregularities of the crystal lattice forming the transmission path, such as defects. The frequency of these inelastic scattering events, characterized by the mean scattering time for inelastic scattering of an electron, or by its mean phase loss time, can therefore be controlled by adjusting the phonon density by changing the temperature of the thermal bath 70.4, or by changing the defect density present in the lattice of the transmission structure, for example, by adding defects on purpose to a defect-poor crystal. In this manner, a transmission structure as shown in FIG. 8 can be obtained. In this transmission structure 80.1 with asymmetric transmission time, five inelastic scattering centers 80.2 that cause collapses and remissions of the electron waves have been drawn as example.

The device presented in FIG. 6 works in a similar manner. In case the inner part of the transmission structure does not cause inelastic scattering, the device only causes nonreciprocal transmission times for the electrons arriving from left or right. If, however, the inner part of the transmission structure contains inelastic scattering centers or trapping centers, the device exerts a sorting function for the electrons.

At this point, the gist of the disclosure can be readily understood and appreciated. To explain the device function we start by considering the case that the density of inelastic scattering centers has been chosen such that the mean inelastic scattering time is of the order of the difference of the transmission times of electrons originally travelling from the left and from the right.

An electron arriving from port A passes swiftly through the transmission structure and has therefore only a small probability to undergo a collapse event. An electron wave leaving port A will therefore have a rather high probability to be transmitted to port B.

As determined by transmission structure's geometry, an electron arriving from port B has to spend a long time in the transmission structure, however. This electron wave therefore features a high probability for a collapse, and, as explained above with the help of FIG. 7, also a rather high probability to be diverted by the collapse to then travel back to port B.

The probability for transmission through the transmission structure is therefore asymmetric: electron waves travelling from port A to B have a higher probability of transmission through the device than electron waves travelling from port B to A.

This understanding is confirmed by strict calculations, in which electron trajectories are determined by adding to the unitary evolution of the quantum mechanical states as described by the Schrödinger equation individual events of inelastic scattering, which were determined by a Monte-Carlo-type method. FIG. 9B shows the result of such calculations for electrons travelling in a transmission structure as shown in FIG. 9A.

FIG. 9A shows again the exemplary structure of FIG. 3B with a longitudinal asymmetry for which the Schrödinger equation has been solved by exact diagonalization using a tight-binding model with reference to the lattice points drawn as black dots. These lattice points may be visualized, for example, as atoms. The white circle marks the lattice point that is the location of the potential inelastic scattering center.

Figure 9A:
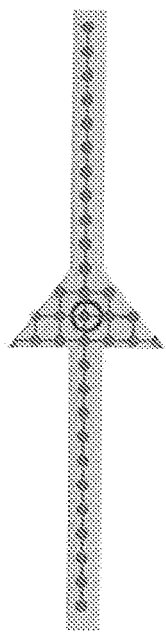
FIG. 9 comprises FIG. 9A and FIG. 9B.
FIG. 9B presents the sorting function for wave packets describing electrons travelling from the left to the right and in reverse direction through the structure shown in FIG. 9A. The sorting has been calculated by solving the Schrödinger equation using exact diagonalization and by introducing inelastic scattering events causing quantum collapses by a Monte-Carlo procedure.
Figure 9B:
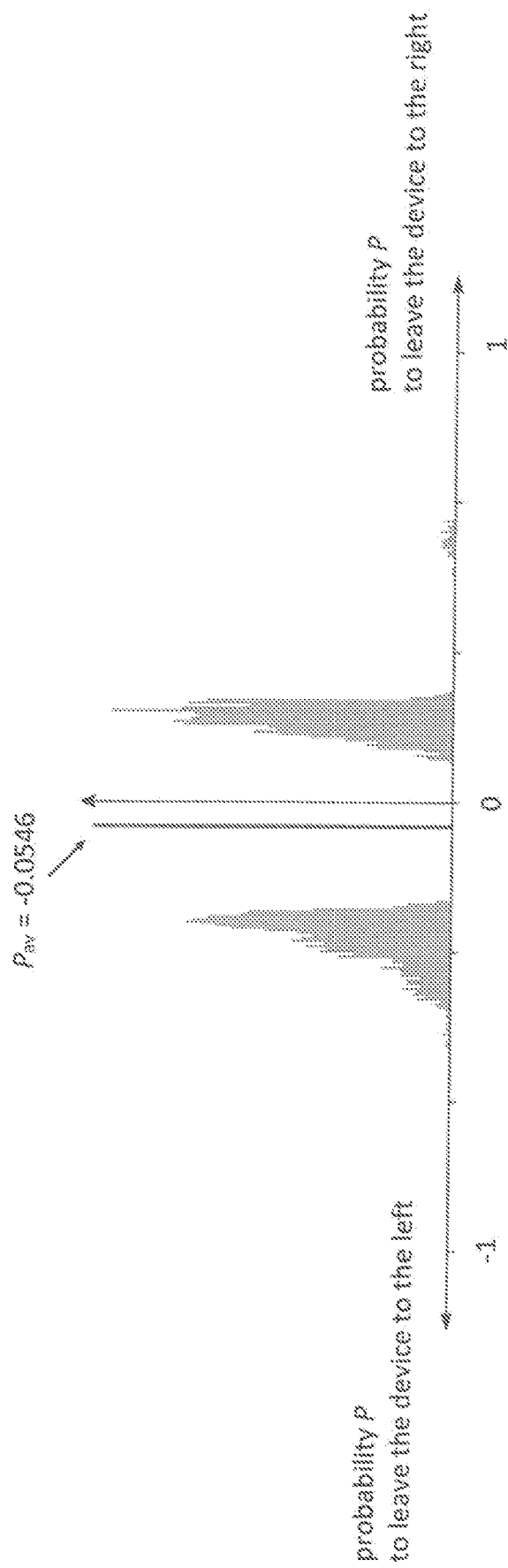

FIG. 9B shows the sorting characteristic of the device of FIG. 9A if inelastic scattering is taken into account, with a mean scattering time of the order of the reflection time difference for both directions. FIG. 9B has been obtained by performing Monte-Carlo calculations on an ensemble of 2304 electrons. The Figure shows the fractional charges (i.e., probabilities P) of these electrons leaving the device via the left or right port. Explicit examples: an electron with P=0 leaves the device with equal probability to the left and to the right, for P=−1, it leaves the device to the left. With P=0.5 it leaves the device with 75% probability to the right. As the figure shows, the arithmetic average of all electrons Pay~−0.0546. Therefore significantly more electrons leave the device to the left than to the right, i.e., the device exerts a sorting function on the electrons.

Figure 10:
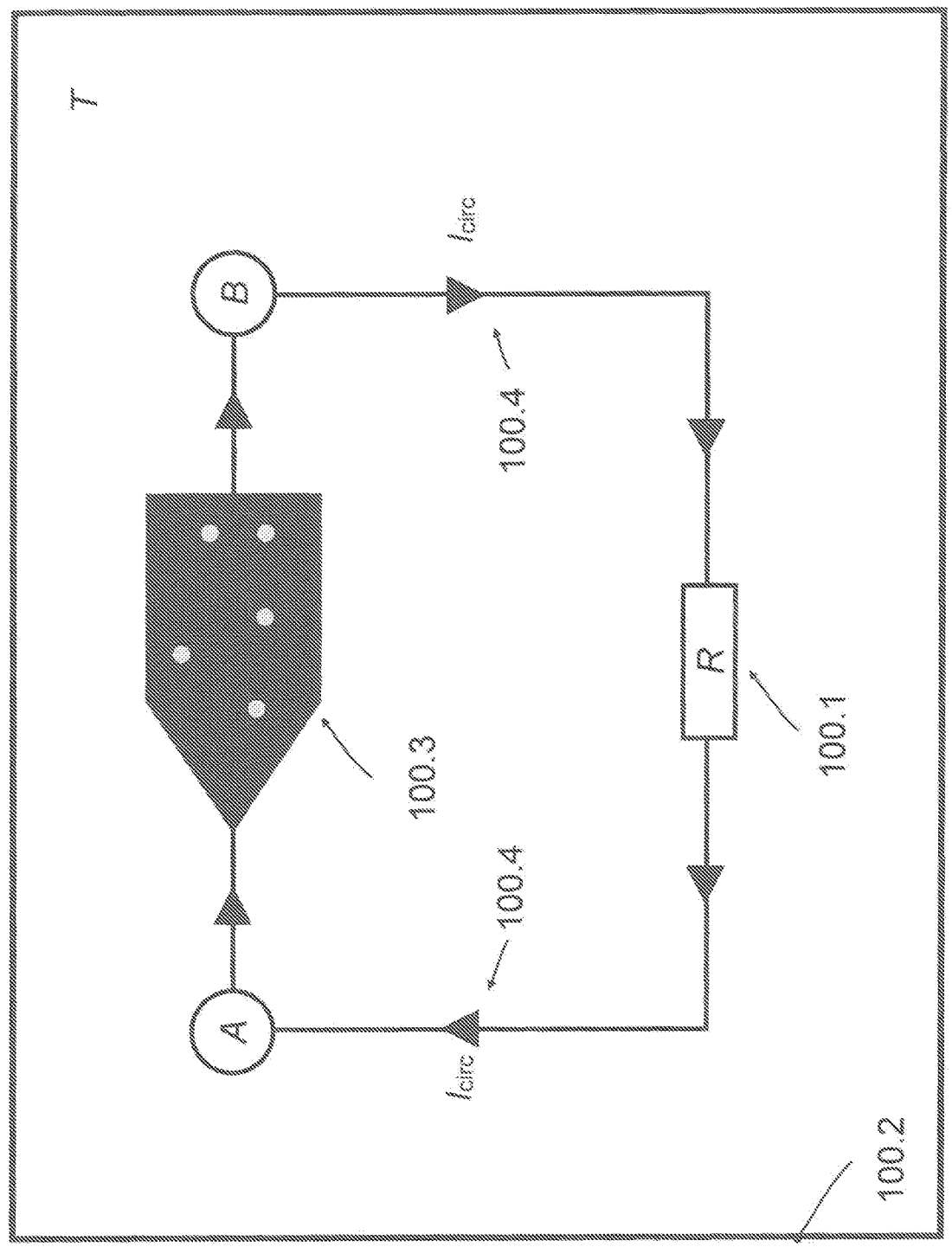
FIG. 10 shows a transmission structure with a longitudinal asymmetry electrically connected in a loop with a resistor R. The complete arrangement is isolated from the environment by means of an enclosure. When the device is started at thermal equilibrium, each device component is characterized by the same temperature T

To illustrate the functioning of the device by using the example of the device shown in FIG. 8, we analyze the device behavior in a circuit, in which the device is connected in a closed loop with a resistor R (100.1) (see FIG. 10).

The whole arrangement is arranged in a closed environment (100.2), and started at a uniform temperature T.

Because the resistor R (100.1) is operated at a temperature T, it induces a fluctuating, thermal noise current flowing through the resistor that is quantified by the Johnson-Nyquist equation [Johnson, 1928; Nyquist, 1928] as I_noise=sqrt (4 kT Δf/R)). Here, the frequency band Δf describes the effective bandwidth over which the current is induced, and k_B is Boltzmann's constant. This fluctuating current consists of electron wave packets that pass through the ports A and B. Because the body of the device (100.3) has a higher transmission and by this a smaller resistance for wave packets travelling from A to B than in opposite direction, on time average a circulating electron current I_circ (100.4) is induced in the loop, as illustrated in FIG. 10. Because I_circ (100.4) passes through R (100.1), it is accompanied by a voltage V=I_circ×R arising between the ports A and B, port B being more negative than port A.

Figure 11:
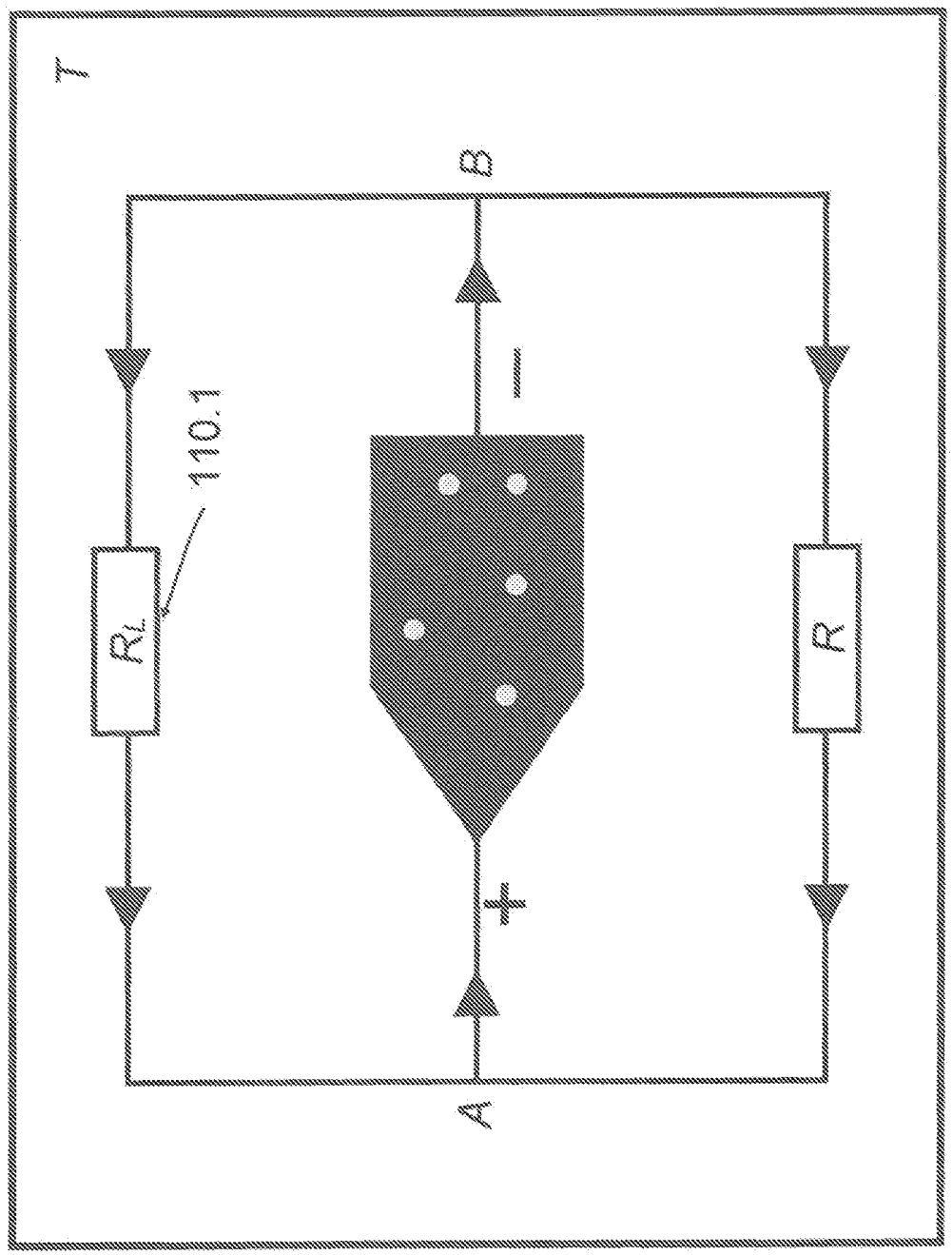
FIG. 11 shows a transmission structure with a longitudinal asymmetry electrically connected in a loop with a resistor R and a load resistor R_L. Except for two electrical wires, the complete arrangement is isolated from the environment by means of an enclosure. When the device is started at thermal equilibrium, each device component is characterized by the same temperature T The load resistor R_L may be given by the inductance of a motor, which lifts a load.

The voltage V and the circulating current I_circ may be used to power devices 110.1 characterized by a load resistance R_L, such as lamps or motors (FIG. 11). If so done, the energy to power these devices is provided by the thermal energy associated with T, such that T decreases with time.

Comparison to the State of the Art

A) The devices presented are reminiscent to so-called quantum ratchets [Parrondo, Hanggi]. Benefitting from a longitudinal asymmetry of the device structure, quantum ratchets achieve a directed transport of particles and waves in one direction. In difference to the devices disclosed here, for the ratchets to function they have to be excited or "shaken" by a power source, that is not in equilibrium with the device itself [Parrondo, Hanggi]. The reason for this difference between the two device categories rests on the fact that the ratchets fail to make suitable use of quantum collapse events.

B) Asymmetric quantum billiards, see, e.g., [Marlow], quantum dots, see, e.g., [Zumbühl, Marlow], chiral structures, see, e.g., [Krstic], and asymmetric Aharonov Bohm rings, see, e.g., [Leturcq] have also been reported to generate a rectification behavior. In all these cases, their function is achieved as a nonlinear action of the device, which in the community is also known by the term "nonlinear response." For example, in the chiral structures, the current sent through the device generates a magnetic field, which by means of the chirality causes a change in electron scattering, which changes the resistance and thereby acts on the current. The asymmetry of the device voltage therefore scales with current squared. This nonlinear response differentiates all of these devices to the ones proposed in the current disclosure. It is the unique use of quantum collapse events and device asymmetries, that makes the current devices not require nonlinear effects, and therefore enables them to sort individual quantum waves, as desired to achieve the device function (see FIG. 11). Indeed, it has been shown by [Büttiker, 1988] that for devices that do not take advantage of collapse processes and asymmetries as our disclosed devices do, a nonreciprocal transport is not possible in linear response.

C) In [Nieuwenhuizen] a hypothetical system is discussed, which has been claimed to show some disagreement between quantum physics and the second law of thermodynamics. As noted by these authors, however, the disagreement is confined to quantum-mechanically entangled states present only at very low temperatures as these states are destroyed by decoherence processes. Furthermore, the entanglement has to be of multi-particle type. These requirements render the proposed system unrealistic for a practical implementation. In contrast, the present disclosure does not rely on entanglement but on single-particle coherence, collapse processes and interference.

D) We point out that in the field of quantum thermodynamics, see, e.g., [Vinjanampathy], so-called Maxwell's demons are realized that enable unidirectional particle transport and entropy reduction in closed systems. These devices however, achieve the effects mentioned by enhancing the amount of information stored in the demon. Therefore, if regarded together with their "demons," these devices comply with the second law of thermodynamics [Merali]. This is a key difference to the devices presented in the current disclosure, which do not process or store information, and thereby violate the second law of thermodynamics.

E) Finally, it is pointed out again that the devices presented in the current disclosure are reminiscent of the devices presented in [Mannhart, EP Patent Application "Non-reciprocal filters for matter waves;" Braak, 18 180 759.5; Mannhart 2018A; Mannhart 2018B; Mannhart 2019]. The devices of [Mannhart, EP Patent Application "Non-reciprocal filters for matter waves;" Braak, 18 180 759.5; Mannhart 2018A; Mannhart 2018B; Mannhart 2019], however, achieve their function only with the help of a transverse asymmetry of their transmission paths, which necessitates the use of an applied magnetic field. The devices presented here are not relying on a transverse asymmetry. Their longitudinal asymmetry of their transmission paths abandons the need to apply a magnetic field, such that the new devices are more straightforward to implement, easier to scale, and cheaper.

Implementations of the Device

A) The basic structure of the device shown in FIG. 8 can be implemented, for example, by depositing and patterning films of metals, such as gold, silver, or copper onto a suitable substrate, such as $SiO\_2$ or sapphire. The device size has to be chosen such that it is of the order of the phase breaking length of the electrons at the operating temperature. This requirement amounts to typical device sizes of order 100 nm-1 μm for operation at 4.2 K or lower [Imry, Datta]. In this case, the inelastic scattering is provided by a mixture of electron-phonon scattering and crystalline defects, such as grain boundaries. Obviously, the body 80.1 of the transmission structure may also be formed as a loop (such as 20.3), with the scattering centers residing in the conductors.

B) A second, preferable implementation of the device is the use of semiconductors for the transmission structure. Indeed, because their large phase coherence lengths (for GaAs 1.62 μm at low temperatures [Ferry]), semiconductors such as GaAs or related materials offer themselves for the device implementation. The large inelastic scattering length implies that the devices do not need to be patterned to sub-micrometer lengths, or that they can be operated at elevated temperatures. Using semiconductors such as GaAs also enables the use of gate electrodes to define the structures by means of depletion layers, as, for example, practiced in [Leturcq].

C) A third, preferable implementation of the device is the use of organic molecules as transmission structures. Conducting molecules with a longitudinal asymmetry will provide for the time difference in electron conduction for the two travel directions. Electron-phonon scattering or the action of side groups will, for example, induce phase-breaking scattering. The molecules have to be connected to contacts. For metallic contacts, such as gold contacts, this is preferably achieved by utilizing thiophene bonds. Because of the intrinsically small size of molecules and the high intrinsic electron coherency in the molecules, the device implementation with molecules is a preferable one for operation at room temperature or above. This implementation reveals another advantage of the disclosure: the transmission structures, in the present case the molecules, do not need to be aligned with an externally applied magnetic field. This provides, for example, for the freedom of a nominally random orientation of the molecules in three-dimensional space, provided that the proper contacts to the ports be maintained.

In a first variation of this implementation, the molecules may be incorporated into a heterostructure that consists of a metallic electrode (for example, gold) deposited onto a substrate (for example, silicon). On this metal layer one or several layers of these molecules are grown, typically with a preferred orientation. These molecules are contacted on their top by yet another metallic layer (for example, gold or silver). In case the two metallic layers differ by their electronic properties, longitudinally symmetric molecules may be used for the reasons described above.

In a second variation of this implementation the function of the molecules is achieved by a nanopatterned or micropatterned two-dimensional material such as MoS2 or graphene. For some applications it may furthermore be beneficial to use multilayers of two-dimensional materials, for example, bilayers of graphene. The two-dimensional material or the multilayer may, for example, be patterned into conducting lines, nanoribbons, stripes, or may be patterned to comprise a hole or an arrangement of holes.

D) In a fourth possible device embodiment we provide an example of how these devices could be arranged in arrays to enhance the effects. FIG. 12A shows part of a larger one-dimensional array of transmission structures. In this example, the inner parts (120.1) of the transmission structures are taken to be symmetric. These structures are connected to asymmetric contacts, which consist of two layers 120.2 and 120.3. These two layers create electron wave packets of different shapes (see FIG. 6) and thereby induce the device action. In case the contacts have a phase-breaking length that is much smaller than the contact thickness, the output voltage of an array comprising n individual devices will be n times the output voltage of a single device. This is the case, because there is no need for phase coherence to be established across the whole array.

FIG. 12B illustrates that it is trivial to extend the principle of one-dimensional arrays to higher order arrays. The two-dimensional array shown in FIG. 12B has an output power that scales with number of individual devices (120.1) in the array, and an output voltage proportional to the number of individual devices (120.1) in longitudinal direction.

Figure 13:
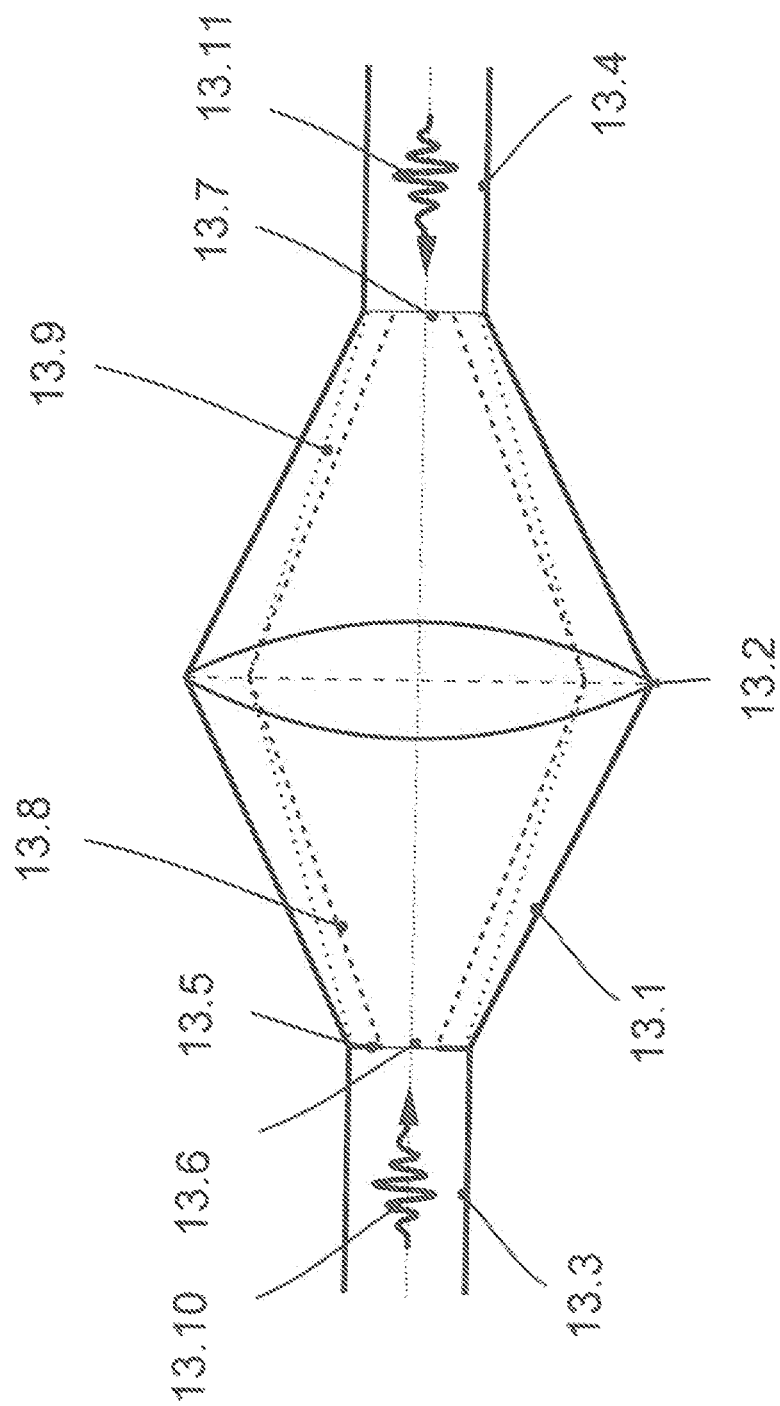
FIG. 13 shows a transmission structure, which uses photons as quantum waves and which comprises a first port and a second port, an optical projection system connecting the two ports, and two apertures with different openings widths on left and right sides of the optical projection system.

An implementation of the disclosure that uses photons as quantum waves is given in FIG. 13. In this implementation, a transfer unit enclosed by the enclosure 13.1 incorporates an optical projection system 13.2 such as a lens and connects the two ports 13.3 and 13.4. The enclosure 13.1 is, for example, formed from a metal with a reflection coefficient close to one and therefore a vanishing emission coefficient. It thus acts as a mirror. The optical projection image is designed to image with a 1:1 ratio the aperture 13.7 onto the entrance of 13.3 that consists of the aperture 13.6 and a reflecting ring 13.5. The corresponding optical path is illustrated by 13.8 and 13.9. This projection functions obviously also in the reverse direction.

In the following case (a) the projection system 13.2 is built from a completely transparent material.

(a) A quantum wave consisting of a wave packet 13.10 arriving at the transfer unit from the left is either reflected by the protrusion 13.5 back into 13.3 or passes through 13.6, the lens 13.2 and the inner part of the aperture 13.7 into 13.4 to leave the system to the right. A quantum wave consisting of a wave packet 13.11 arriving at the transfer unit from the right passes 13.7 and 13.2. It then either leaves the system through 13.6 and 13.3 to the left, or is reflected by 13.5 to pass 13.2 and 13.7 to leave the system to the right. The design of the system therefore guarantees that if quantum wave packets arrive in equal number from the left (13.10) and from the right (13.11), the photonic waves passing the lens 13.2 to the left and to the right arise in a larger number from 13.11 than from 13.10. Despite this asymmetry, the total transmission coefficient of the system is symmetric: if quantum waves arrive in equal number from the left (13.10) and from the right (13.11) they will also leave in equal numbers to the left and to the right.

(b) Now we consider the case that the lens 13.2 is built from a material that introduces absorption and random reemission by inelastic scattering of a part (say, 10%) of the quantum waves that pass through it. It is obvious that this absorption and reemission affects to a larger number the quantum waves originating from 13.11, as they pass the lens in larger numbers than the waves originating from 13.10. Because the reemission of the quantum waves by 13.2 is random in nature, the reemitted waves are emitted in equal numbers to the left and to the right. As due to the ring 13.5 the aperture 13.6 is smaller than the aperture 13.7, a larger number of these reemitted waves leave the system to the right through 13.4 than through 13.3 to the left. Due to this effect, quantum waves 13.11 arriving from the right are reflected by the transfer system to the right in large numbers. Quantum waves 13.10 arriving from the left are reflected by the transfer system to the left in smaller numbers. By this nonreciprocity, the transfer system creates the desired imbalance between the quantum wave populations of 13.3 and 13.4.

It should be added that another photonic device can be provided, which is construed according to the same principle as the electronic device of FIG. 6. Such a photonic device would also comprise first and second ports fabricated from different materials, which would emit photonic waves with wave packets of different shapes such that transmission times would differ for wave packets travelling in opposite directions. It should furthermore be mentioned that also the geometry of the transmission path shown in FIG. 2 or FIG. 8 present two simple embodiments only. The paths may be more complex, and comprise, for example, several loops, also using the third dimension of space. Also other components such as additional scatterers, nonreciprocal filters, or further black bodies may be included.

It is noted that the abandoned need to apply magnetic fields for device operation is a great advantage of the proposed devices, as it simplifies in many cases device applications. However, this does not imply that the devices must be operated without magnetic field. They also function in magnetic fields, and such an operation may, for example, be desired if otherwise the devices would not to be screened from background magnetic fields.

It should furthermore be mentioned that for some applications it may be preferable to combine the device architectures of the devices presented in [Mannhart, EP Patent Application "Non-reciprocal filters for matter waves;" Braak, 18 180 759.5; Mannhart 2018A; Mannhart 2018B; Mannhart 2019] based on a transverse asymmetry with the devices presented in the present disclosure. While this combination will in most cases require the unwanted use of a magnetic field, the devices using the larger parameter range available by breaking all symmetries may operate under some circumstances with an enhanced efficiency or robustness.

A method for operating a quantum device could be defined as comprising providing a source of the first waves, wherein at least one source of the first waves is held in thermal contact with an environment. The environment can be a natural environment like a room being at room temperature, or a place in free nature. It can also be an artificial environment such as the cavity containing the device, or such as a thermal bath provided, for example, by a water bath or a hot oven.

A method for operating a quantum device according to the first aspect could alternatively or in addition be defined as comprising providing a source of the first waves, wherein the source of the first waves is not actively stimulated, in particular, not actively stimulated by non-thermal energy so that it would be possible that the source is actively heated or cooled.

It is noted that the behavior of the devices does not agree with the zeroth or the second law of thermodynamics, according to the manner these laws are today commonly understood and presented in the textbooks [Reichl]. The zeroth law is violated because the two ports A and B brought into thermal contact via the transmission structure do not maintain an equal temperature, but rather develop a temperature difference if the device generates an output power.

The second law is violated because in this closed system the state of uniform temperature distribution, i.e., the state of maximal entropy is unstable such that the system moves into a state of lower energy. By some experts like e.g., the famous physicist Enrico Fermi a disagreement with the second law was anticipated [E. Fermi].

Indeed, for many decades it has been dreamed about which advantages a then-still hypothetical device would entail that would violate the second law of thermodynamics, see, e.g., [Capek].

Nevertheless, as known by the expert and by the layman, see e.g., [Merali, Reichl], a practical device that breaks the second law of thermodynamics, commonly known as a perpetuum mobile of the second kind, has only been speculated about. Current discussions are focused on devices that use quantum effects occurring at temperatures close to absolute zero, in particular, quantum entanglement, as summarized in [Nieuwenhuizen]. Due to a lack of ideas about how a practical device could work, these studies have never made the transition from speculations to functioning devices. Indeed, most members of the scientific community are convinced that such a device may, by principle, never be built.

It should further be mentioned that the above-described quantum devices and their applications may require some coupling to heat baths. The medium of such a heat bath can be solid, liquid or gaseous. The devices may extract energy from one or of several of the heat baths and transfer the heat energy, e.g., to one or several other heat baths.

It is a further valuable aspect of the present disclosure that easy control can be established over the processes driven by the quantum collapse. The device function can be influenced or controlled, for example, by adding additional electrical components such as resistors, capacitors, batteries, inductors, sensors, controllers or switches to the circuits. The systems may also be equipped with an input terminal for process control. Internally or externally created signals may be used to control the process.

The present disclosure also relates to a device utilizing a longitudinal device asymmetry and at least partial quantum-physical collapses of wave functions to shift a system out of the state of thermal equilibrium.

The present disclosure also relates to a device utilizing a longitudinal device asymmetry and at least partial quantum-physical collapses of wave functions to generate temperature differences within one body or between several bodies.

In a device according to any one of the above aspects the at least partial quantum physical collapse and an at least partial absorption of the wave function at a body is followed by a statistical reemission of a quantum wave by the body.

In a device according to any one of the above aspects an at least partially quantum physical collapsed wave is statistically replaced by another quantum wave with a random phase.

In a device according to any one of the above aspects the device creates useful work by converting a generated radiation density inhomogeneity or a generated temperature difference into electricity, radiation, optical energy, or other forms of energy, or by using the achieved entropy reduction or order in some other manner.

In a device according to any one of the above aspects the device may transport mass, particles, energy, heat, momentum, angular momentum, charge, or magnetic moments within one body or between several bodies.

In a device according to any one of the above aspects the device charges a storage system for energy, waves or matter, for example, a capacitor or a battery.

In a device according to any one of the above aspects the device heats or cools bodies.

In a device according to any one of the above aspects one or several of the bodies of the device are operated at another base temperature than room temperature, for example, by using an additionally provided heating or cooling function.

The key elements contributing to the apparent violation of the second law are the longitudinal asymmetry of the transmission path, the generation of particle states in the form of wave packets, the quantum mechanical collapse of the wave-packet states, and the sorting of single and multiple wave-packet states by interference. These robust, single-particle processes are scalable, they may function in a wide temperature range including high-temperatures, are compatible with a standard room-type environment, and can be implemented in a large variety of devices acting on many species of quantum waves, including electromagnetic, particle and quasiparticles waves.

While the disclosure has been illustrated and described with respect to one or more implementations, alterations and/or modifications may be made to the illustrated examples without departing from the spirit and scope of the appended claims. In particular, with regard to the various functions performed by the above described components or structures (assemblies, devices, circuits, systems, etc.), the terms (including a reference to a "means") used to describe such components are intended to correspond, unless otherwise indicated, to any component or structure that performs the specified function of the described component (e.g., that is functionally equivalent), even though not structurally equivalent to the disclosed structure, which performs the function in the herein illustrated exemplary implementations of the disclosure.

The invention claimed is:

1. A quantum device, comprising:
   a transmission structure connected between at least a first port and a second port, wherein first quantum waves are emitted by the first port and the second port and traverse the transmission structure in a forward direction from the first port to the second port and in a backward direction from the second port to the first port; wherein a unit of the transmission structure together with the first port and the second port is asymmetric in a direction connecting the first port to the second port;
   and wherein the transmission structure or the first port and the second port are furthermore configured such that wave functions of the first quantum waves experience an at least partial collapse or decoherence in the transmission structure or in the first port or the second port, or are generated by the at least partial collapse or decoherence in the first port or the second port,
   and wherein second quantum waves generated by the at least partial collapse or decoherence of the first quantum waves propagate to one of the first port and the second port or generate further second quantum waves.

2. The quantum device according to claim 1, wherein
   the transmission structure is designed such that for the first quantum waves traversing the transmission structure in the forward direction a forward traversal time through the transmission structure is shorter than a backward traversal time through the transmission structure for the first quantum waves traversing the transmission structure in the backward direction, wherein
   a transmission time difference between the forward traversal time and the backward traversal time is induced by a device asymmetry along the transmission structure implemented into the quantum device.

3. The quantum device according to claim 1, wherein the first port and the second port comprise different materials and/or materials with different properties.

4. The quantum device of claim 1, wherein a device asymmetry is provided by an asymmetric distribution of defects incorporated into the quantum device.

5. The quantum device according to claim 1, wherein the first quantum waves and the second quantum waves are given by de-Broglie waves of electrons.

6. The quantum device according to claim 1, wherein the transmission structure comprises a structure fabricated from an electron conductor, the electron conductor including one or more of a semiconductor, a metal, a two-dimensional material, multilayers involving one or more two-dimensional materials, a molecular conductor, or other conducting organic material.

7. The quantum device according to claim 1, wherein no external voltage is applied between the first port and the second port.

8. The quantum device according to claim 1, wherein the transmission structure is operated in a magnetic field or in a temperature gradient.

9. The quantum device according to claim 1, wherein the at least partial collapse is induced at least one of by inelastic scattering or by decoherence.

10. The quantum device according to claim 1, wherein a mean phase breaking time of the first quantum waves is between $10^{-3}$–$10^{3}$ of a transmission time difference between the first quantum waves travelling in the forward direction and the backward direction through the transmission structure.

11. The quantum device according to claim 1, wherein the asymmetric unit of the transmission structure together with the first port and the second port is achieved by a geometrical shape of a second transmission structure embedded in the transmission structure.

12. The quantum device according to claim 11, wherein the second transmission structure is simply connected between the first port and the second port.

13. The quantum device according to claim 11, wherein the second transmission structure is multiply connected between the first port and the second port.

14. The quantum device according to claim 1, wherein a transmission time difference between the first quantum waves travelling in the forward direction and the backward direction through the transmission structure is achieved by a difference of the first port and the second port, in particular, by wave packets emitted by the first port and the second port, in particular, by a difference of shapes of envelope functions of the first quantum waves traveling in the forward direction and the backward direction through the transmission structure.

15. The quantum device according to claim 1, wherein action of the transmission structure is altered by moving or turning parts of the transmission structure, by changing transmission properties of transmission paths, or by changing properties of the transmission structure by mechanical, electrical, magnetic, or optical inputs.

16. A device including one-dimensional, two-dimensional, or three-dimensional arrangements of multiple quantum devices, each of the quantum devices according to the quantum device of claim 1, the device including arrangements of the quantum devices to form array-type structures.

17. The device according to claim 16, wherein the arrangements are given by a lattice structure of a solid, in particular, by a crystalline lattice.

18. The device according to claim 16, wherein the arrangements comprise organic molecules or two-dimensional materials.

19. The quantum device according to claim 1, wherein the quantum device is configured to one or more of:
- achieve a deviation from the zeroth or the second law of thermodynamics;
- shift a system out of a state of thermal equilibrium;
- generate temperature or voltage differences within one body or between several bodies;
- transport particles, information, momentum, angular momentum, charge, magnetic moment, or energy; or
- generate electric currents or electrical power.

20. The quantum device according to claim 19, wherein the quantum device operates at a temperature in a range from 1 mK-4000 K.

21. The quantum device according to claim 19, wherein an energy distribution of the first quantum waves or the second quantum waves is generated at least partially by thermal energy.

* * * * *

UNITED STATES PATENT AND TRADEMARK OFFICE
CERTIFICATE OF CORRECTION

PATENT NO. : 12,288,816 B2
APPLICATION NO. : 17/630102
DATED : April 29, 2025
INVENTOR(S) : Jochen Mannhart et al.

It is certified that error appears in the above-identified patent and that said Letters Patent is hereby corrected as shown below:

In the Specification

| | | |
|---|---|---|
| Column 1, | Line 62, | change "14. P. Hanggi," to --14. P. Hänggi,-- |
| Column 1, | Line 65, | change "16. D. M. Zumbal et al.," to --16. D. M. Zümbal et al.,-- |
| Column 2, | Line 14, | change "In Ref (Mannhart," to --In Ref. (Mannhart,-- |
| Column 2, | Line 19, | change "In Ref (Braak," to --In Ref. (Braak,-- |
| Column 5, | Line 8, | change "same temperature T" to --same temperature T.-- |
| Column 5, | Line 15, | change "temperature T The" to --temperature T. The-- |
| Column 8, | Line 6, | change "in Ref (Mannhart," to --in Ref. (Mannhart,-- |
| Column 10, | Lines 31-32, | change "electrons Pay~-0.0546." to --electrons $P_{av} \sim -0.0546$.-- |
| Column 10, | Line 64, | change "[Parrondo, Hanggi]." to --[Parrondo, Hänggi].-- |
| Column 11, | Line 3, | change "[Parrondo, Hanggi]." to --[Parrondo, Hänggi].-- |

In the Claims

| | | | |
|---|---|---|---|
| Claim 10 | Column 17, | Line 30, | change "between 10^-3-10 ^3 of a" to --between 10^-3 – 10^3 of a-- |

Signed and Sealed this
Fifteenth Day of July, 2025

Coke Morgan Stewart
*Acting Director of the United States Patent and Trademark Office*